United States Patent [19]

Ryder

[11] Patent Number: 4,868,487
[45] Date of Patent: Sep. 19, 1989

[54] FREQUENCY RESPONSE ANALYSER WITH MULTIPLYING DIGITAL TO ANALOGUE CONVERTER

[75] Inventor: Alan Ryder, Church Crookham, England

[73] Assignee: Schlumberger Electronics UK Limited, England

[21] Appl. No.: 121,356

[22] Filed: Nov. 16, 1987

[30] Foreign Application Priority Data

Nov. 15, 1986 [GB] United Kingdom ............. 8627370

[51] Int. Cl.⁴ ............................... G01R 23/14
[52] U.S. Cl. ........................ 324/57 R; 324/79 D; 364/485
[58] Field of Search ............ 324/57 R, 79 D, 78 D, 324/58 A; 364/484, 485.

[56] References Cited

U.S. PATENT DOCUMENTS

| | | | |
|---|---|---|---|
| 3,526,832 | 9/1970 | Post | 324/57 R |
| 3,808,526 | 4/1974 | Jackson | 324/57 R |
| 4,322,806 | 3/1982 | Allison | 364/485 |
| 4,584,650 | 4/1986 | Kozuch | 324/57 R |
| 4,795,963 | 1/1989 | Ueno et al. | 324/57 R |

Primary Examiner—Reinhard J. Eisenzopf
Assistant Examiner—Maura K. Regan

[57] ABSTRACT

In apparatus for performing frequency response analysis of a system under test to establish response coefficients at various frequencies, a look up Read Only Memory is sequentially addressed to give a driving signal. The signal received from a system under test is fed to the analogue input of a multiplying digital to analogue converter, the digital input being fed from a Read Only Memory, storing values of a reference waveform (e.g., sin wt), by which the received signal is multiplied. The integration period of the multiplying digital to analogue converter is selected such that unwanted multiplication products integrate out, leaving the response coefficient at the reference frequency. For speed, a second channel may be used to establish the orthogonal coefficient. Methods are proposed so that the arrangement operates with single or two quadrant multiplying digital to analogue converters and to select harmonic coefficients.

11 Claims, 3 Drawing Sheets

FREQUENCY RESPONSE ANALYSER WITH MULTIPLYING DIGITAL TO ANALOGUE CONVERTER

This invention relates to frequency response analysis. Such analysis, in which the input signal applied to a system is compared with the output signal from the system at various frequencies, is a well-known technique for characterising the behaviour of, for example, servo systems, rotating machinery, electrical and electronic circuits and elastic and viscous materials. The output signal is often analysed by correlating it with reference signals which are in phase and in quadrature phase with the input signal to the system.

Typically, the input signal to the system might be a sine wave and the correlation process involve identifying the components of a return signal from the system under test at the frequency of the input sine wave and at harmonics thereof. The frequency of the input may be swept between limits defining a band of frequencies of interest, and measurements made within the sweep to further characterise the system. In circumstances where the return signal changes rapidly with time, the instantaneous value of a component that might be present in a return signal is seldom of interest, and the average value is the prefered measurement.

Averaging is known in other areas of instrumentation, for example in integrating analogue to digital converters. Such devices serve to provide a numeric output representative of the average value of a signal applied to a device input during an averaging period. Such techniques as dual slope integration and the pulse with conversion technique described in United Kingdom Pat. No. 1 434 414 are well documented elsewhere and do not require further description here.

Also well known in the instrumentation art is the process of digital to analogue conversion, that is of providing an analogue signal having an instantaneous value representative of the numeric value of a digital input applied to a converter. In some such devices, a second input may be applied in analogue form, resulting in an output which has the value of the analogue input multiplied by the value of the digital input. Such devices are termed multiplying digital to analogue converters, and these too are adequately described elsewhere.

To perform the correlation required in frequency response analysis, multiplication of the output signal from the system under test with a reference signal is normally required. One approach is to employ voltage to frequency conversion of the output signal in an arrangement whereby the present numeric values of the reference are added together at a rate determined by the converted frequency, amounting to multiplication. An alternative approach is to analogue to digital convert both reference and output signal and perform the multiplication by means of an arithmetic processor which operates on instantaneous values, the products being averaged by another process. It will be noted that what is required for success with this latter approach is fast conversion of the instantaneous values of the signals, which will be contrasted with the averaging type of analogue to digital converter mentioned above.

According to the present invention a frequency response analyser includes a signal generator for providing a periodic driving signal, means for relaying the driving signal to a system under test, means for receiving an output signal from a system under test, means for deriving a reference signal of digital form, a multiplying digital to analogue converter having an analogue input, a digital input and an analogue output, the analogue input being connected to receive said output signal and the digital input being connected to said reference signal, and an integrating analogue to digital converter arranged to convert the output of the multiplying digital to analogue converter over an integral number of periods of the driving signal.

Preferably said reference signal varies as a sine function of the same period as the driving signal and a second multiplying digital to analogue converter is arranged to multiply the output signal by a second reference signal which varies as a cosine function of the same period as the driving signal, a second integrating analogue to digital converter being arranged to convert the output of the second multiplying digital to analogue converter over an integral number of periods of the driving signal.

Alternatively said reference signal may vary as a first reference function during a first period to establish a first characterising coefficient and may vary as a second reference function during a second period to establish a second characterising co-efficient.

Advantageously the multiplying digital to analogue converter may be of the one quadrant type, and means included to add in a dc level to the analogue input, the reference signal arranged to vary as a function of (1+sine), and means included to subtract a related dc level intermediate the multiplying digital to analogue converter and integrating analogue to digital converter. Similarly, a dc level may be added to the analogue input of a second multiplying digital to analogue converter receiving a signal varying as a function of (1+cosine) at its digital input, and means included intermediate the second multiplying digital to analogue converter and a second integrating analogue to digital converter to subtract a related dc level.

As an alternative, (1+sine) and (1+cosine) functions may be sequentially applied to a single multiplying digital to analogue converter.

Alternatively, the multiplying digital to analogue converter may be of the two quadrant type, allowing its analogue input to be of either polarity. Sign variation of the reference signal may be accomodated by arranging for the analogue input to be inverted whenever the reference signal should take on a negative value. A second multiplying digital to analogue converter of the two quadrant type may be similarly arranged with respect to a second reference signal. As an alternative, a first reference function and a second reference function may be sequentially applied to a single multiplying digital to analogue converter.

Preferably the means for deriving the reference signal includes a memory device, having values of the required reference function stored therein, for example sine or cosine or (1+sine) or (1+cosine). Additionally the memory may be arranged to store values of the harmonics of the required function so that harmonics of the reference signal may be used in correlation.

In some frequency response analysis applications it is desirable to apply a modulated signal to the system under test. In this arrangement, the drive signal is used to modulate a carrier signal, which modulated carrier signal is applied to the system under test. It will be apparent that in such an application, the signal received from the system under test must be demodulated as part of correlation. In a frequency response analyser in accordance with the present invention demodulation may be achieved by rectifying the received signal to one polarity during a first half cycle of the carrier period, and to the other polarity during the second half cycle. Advantageously, a polarity switch connected to selectively invert the received signal is included and controlled to invert the output signal at every alternate half cycle of the carrier to give rectification as aforesaid prior to connection to the multiplying digital to analogue converter. Alternatively, the polarity of the reference signal may be switched, preferably, where the reference is derived from memory, by selectively addressing samples of an inverse reference function stored in memory together with the reference signal samples.

In order that features and advantages of the present invention may be further appreciated two embodiments will now be described, by way of example only and with reference to the accompanying diagrammatic drawings, of which.

In a frequency response analyser (FIG. 1) a drive signal is generated to be available as an input signal to a system under test 10. An output signal is derived from the system under test 10 by means not shown but which might for example comprise an accelerometer or other transducer for reception at a connection point 11 of the frequency response analyser. The drive signal is derived from a read only memory (ROM) 12 which is addressed by the multiple digital outputs of a counter 14. The ROM 12 contains samples of a sinusoidal waveform arranged in order such that when sequentially addressed and d/a converted a sinusoidal drive signal is present at the output of the amplifier 16. The frequency of the drive signal is determined by the frequency of a clock 17, which clocks the counter 14.

Figure 1:
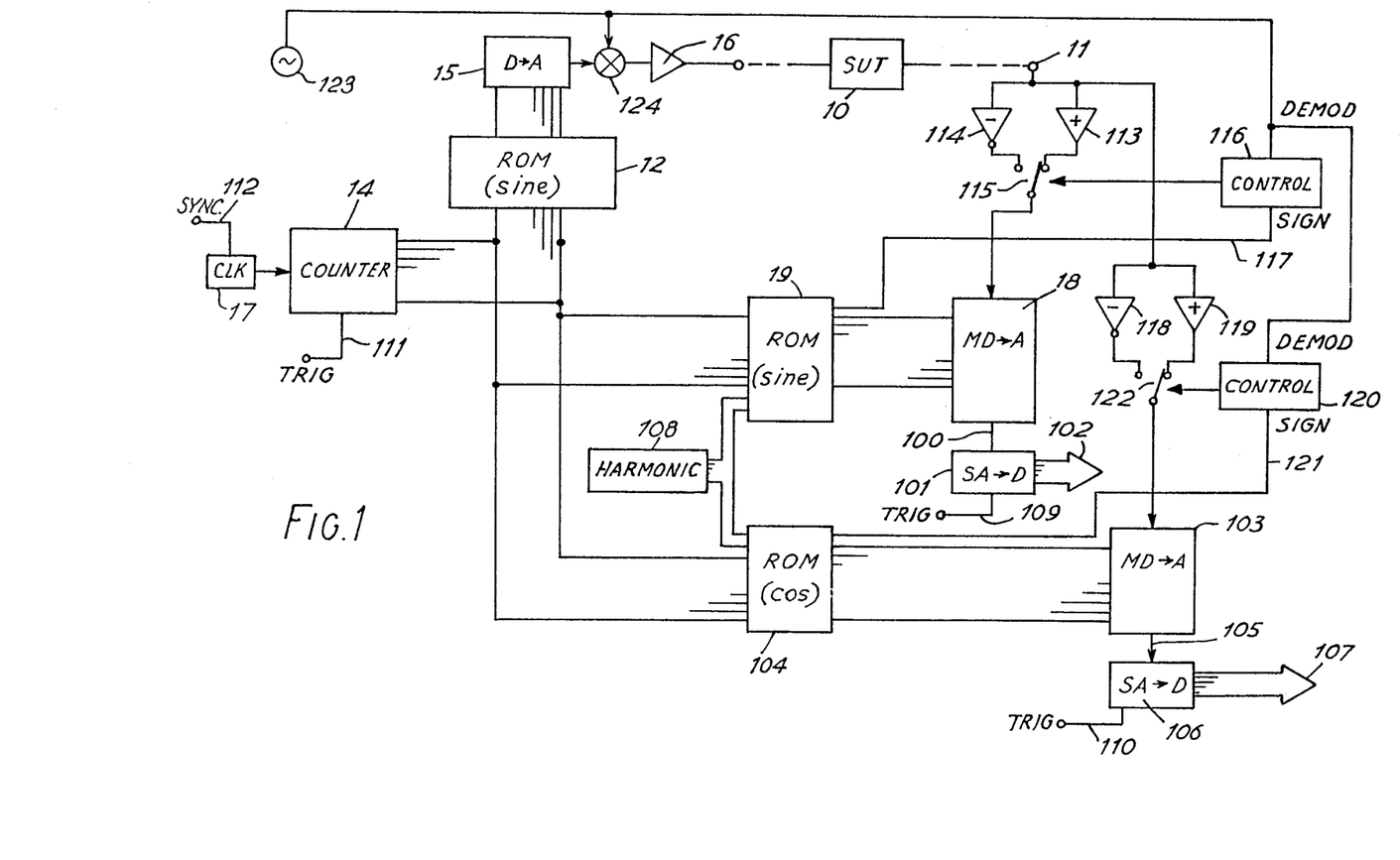
FIG. 1 represents a frequency response analyser including a two quadrant multiplying digital to analogue converter.

The signal received from the system under test is relayed to the analogue input of a multiplying digital to analogue converter 18. The digital input for the multiplying digital to analogue converter 18 is derived from a ROM 19, which is addressed by the data output lines of counter 14 in a way analogous to the ROM 12. The ROM 19 is arranged to contain sequential samples of a reference signal, which in this embodiment is a sine wave, to derive a signal in digital form which is connected to the digital input of the multiplying digital to analogue converter 18 as described above. The multiplying digital to analogue converter 18 provides an analogue output 100 which is relayed to an integrating analogue to digital converter 101 to give a digital output 102.

The operation of the above embodiment of the present invention will now be described in more detail.

The addressing of the ROM 12 by the data output of the counter 14 leads to a sinusoid of an angular frequency w and of amplitude A appearing at the output of the amplifier 16. Thus the driving signal may be represented as A sin wt. Following application to the system under test, the received signal at input 11 will generally not be of this form, but may contain many components of varying instantaneous amplitude. In accordance with the known principals of Fourier analysis the received signal, V(t), may be represented by a sine and cosine series of the form:

$$V(t) = a_0 + a_1 \sin wt + a_2 \sin 2wt + a_3 \sin 3wt +$$
$$\ldots + a_n \sin n\, wt$$
$$+ b_0 + b_1 \cos wt + b_2 \cos 2wt + b_3 \cos 3wt +$$
$$\ldots + b_n \cos n\, wt$$

A typical objective of frequency response analysis might be to establish the level of the components ($a_1$, $b_1$) at the fundamental frequency present in the signal from the system under test following application of the driving signal.

Assuming that the received signals were relayed either directly or by a path of unity gain, then this signal V(t) would be present at the analogue input of the multiplying digital to analogue converter 18. That is assuming switch 115 were permanently connected to amplifier 113 having unity gain; (the functions of switch 115 and amplifiers 113 and 114 are described hereinafter). By virtue of addressing the ROM 19 by the data outputs of the counter 14, a reference sinusoid B sin wt of known amplitude and of the same frequency as the driving signal is generated, and relayed to the digital inputs of the multiplying digital to analogue converter 18. As is known, the function of a multiplying digital to analogue converter is to multiply the instantaneous values of signals applied to its analogue and digital inputs, and to provide an analogue value representative of the result. Thus for the multiplying digital to analogue converter 18, the signal at its analogue output 100, $x_1(t)$, may be represented by the product of the signal at input 11, V(t) and the output of the ROM 19, taken together with the sign switching function effected by sign bit 117, control 116 and switch 115, B sin wt; thus $x_1(t) = B \sin wt \cdot V(t)$.

Substitution of the expanded version of V(t) leads to the following:

$$x_1(t) = Ba_1 \sin^2 wt + Ba_2 \sin wt \cdot \sin 2wt +$$
$$Ba_3 \sin wt \cdot \sin 3wt + \ldots + Ba_n \sin wt \cdot \sin n\, wt +$$
$$Bb_1 \sin wt \cdot \cos wt + Bb_2 \sin wt \cdot \cos 2wt +$$
$$Bb_3 \sin wt \cdot \cos 3wt + \ldots + Bb_n \sin wt \cdot \cos n\, wt$$

By applying well known trigonometrical relationships, this expression may be expanded to:

$$x_1(t) = \frac{Ba_1}{2}(1 - \cos 2wt) + \frac{Ba_2}{2}(\cos wt - \cos 3wt) +$$
$$\frac{Ba_3}{2}(\cos 2wt - \cos 4wt) + \ldots +$$
$$\frac{Ba_n}{2}(\cos(n-1)wt - \cos(n+1)wt) +$$
$$\frac{Bb_1}{2}(\sin 2wt) + \frac{Bb_2}{2}(\sin 3wt - \sin wt) +$$

$$\frac{Bb_3}{2} (\sin 4wt - \sin 2wt) + \ldots +$$

$$\frac{Bb_n}{2} (\sin (n+1) wt - \sin (n-1) wt)$$

The above expression gives the instantaneous value for any time, t, of the signal at the output of the multiplying digital to analogue converter 18. This signal is connected to the input of the integrating analogue to digital converter 102, which is arranged to have an integration period of one complete cycle of the fundamental reference signal B sinwt, that is a period of $2\pi/w$. The digital output 102 of the integrating analogue to digital converter 101, $y_1(t)$, is thus:

$$y_1(t) = \int_0^{\frac{2\pi}{w}} x_1(t) \, dt$$

By examination of the expansion of $x_1(t)$ above it will be apparent that the only component providing a non-zero integral over the complete period is the dc term $Ba_1/2$. Hence:

$$\overline{y_1(t)} = \frac{B\pi}{w} \cdot a_1$$

It will be observed that B, $\pi$ and w are all either constant or known, and that thus the value of the output 102 of the integrating analogue to digital converter 101 at the end of the averaging period may be directly related to a required coefficient $a_1$ characterising the frequency response of the system under test 10.

In the present embodiment two parallel signal processing channels are used and a second multiplying digital to analogue converter 103 also receives the signal received from the system under test $x_1(t)$, at its analogue input. The digital input to this multiplying digital to analogue converter 103 is supplied from a ROM 104, addressed by the data outputs of the counter 14, in a way analogous to ROM 19, excepting that the ROM 104 is loaded with samples of a cosinusoid. Thus the ROM 104 provides a reference signal C.coswt in digital form. Analogue output 105 of multiplying digital to analogue converter 103 may thus be represented by V(t). Ccoswt. The signal appearing at the output 105 is fed to an integrating analogue to digital converter 106 having a digital output 107. The integrating analogue to digital converter 106 is arranged to have an integrating period of one cycle of the fundamental reference waveform, that is $2\pi/w$.

An analysis similar to that performed for the behaviour of multiplying digital to analogue converter 18 and integrating analogue to digital converter 101 may be performed for multiplying digital to analogue converter 103 and integrating analogue to digital converter 106.

Representing the signal received from the system under test, V(t), as:

$$V(t) = \sum_{n=1}^{N} a_n \sin nwt + b_n \cos nwt,$$

then the output of multiplying digital to analogue converter 103, $x_2(t)$, (that is (V(t).Ccoswt) may be represented by:

$$x_2(t) = Ca_1 \cos wt \cdot \sin wt + \sum_{n=2}^{N} Ca_n \cos wt \cdot \sin nwt +$$

$$Cb_1 \cos^2 wt + \sum_{n=2}^{N} Cb_n \cos wt \cdot \cos nwt$$

This expression for $x_2(t)$ may be expanded to:

$$x_2(t) = \frac{Ca_1}{2} \cdot \sin 2wt + \sum_{n=2}^{N} \frac{Ca_n}{2} (\sin (1+n) wt +$$

$$\sin (1-n) wt) + \frac{Cb_1}{2} (\cos 2wt + 1) +$$

$$\sum_{n=2}^{N} \frac{Cb_n}{2} (\cos (1+n) wt + \cos (1-n) wt)$$

This expression for $x_2(t)$ gives the instantaneous value of the analogue output signal 105 of the multiplying digital to analogue converter 103. The output of the integrating analogue to digital converter, $y_2(t)$ is given by:

$$y_2(t) = \int_0^{\frac{2\pi}{w}} x_2(t) \, dt$$

By examination of the expansion of $x_2(t)$ above, it will be apparent that the only component providing a non-zero integral over a complete cycle of the reference signal Ccoswt is the dc term $-Cb_1/2$, hence:

$$\overline{y_2(t)} = \frac{C\pi}{w} \cdot b_1$$

In similar fashion to $\overline{y_1(t)}$ and integrated analogue to digital converter 101, it will be observed that the output 107 of integrated analogue to digital converter 106 at the end of the averaging period may be directly related to a required coefficient $b_1$ characterising the frequency response of the system under test 10.

In general further analysis will be required on the system under test, and it will be desirable to determine at least some of the remaining coefficients $a_2, a_3, \ldots, a_n$ and $b_2, b_3, \ldots, b_n$, that is, the average magnitude of the components of the received signal at harmonics of the fundamental drive signal are sequenced. In order to achieve this further analysis, different reference waveforms of the general two forms Bsin nwt and Ccos nwt may be applied to the digital inputs of multiplying digital to analogue converters 18 and 103 respectively. For each reference signal applied, different signals respectively $x_{1n}(t)$ and $x_{2n}(t)$ will be provided at outputs 100 and 105 of the multiplying digital to analogue converters 18 and 103.

Representing the received signal by the expression:

$$V(t) = \sum_{i=1}^{N} a_i \sin iwt + b_i \cos iwt,$$

then for generalised reference signals B sinmwt, C sinmwt, the output signals from the multiplying digital to analogue converters 18, 103 respectively may be represented as:

$$x_{1n}(t) = \sum_{n=1}^{N} B a_n \sin m \, wt \cdot \sin n \, wt + B b_n \sin m \, wt \cdot \cos n \, wt,$$

and $$x_{2n}(t) = \sum_{n=1}^{N} C a_n \cos m \, wt \cdot \sin n \, wt + C b_n \cos m \, wt \cdot \cos n \, wt$$

It will be appreciated that the only dc terms present in these expressions are $$\frac{Ba_n}{2} \text{ and } \frac{Cb_n}{2}$$

respectively, which arise for the case for n=m. By virtue of the integrating nature of integrating analogue to digital converters 101 and 106, only these dc terms will be responsible for the respective outputs 102, 107 of the multiplying analogue to digital converters provided the integration interval of $2\pi/w$ is retained. Thus:

$$y_{1n}(t) = \frac{B\pi}{w} \cdot a_n \text{ and } y_{2n}(t) = \frac{C\pi}{w} \cdot b_n$$

The outputs 102, 107 at the end of the averaging period may therefore be directly related to the required characterising coefficients $a_n$, $b_n$, respectively.

The application of the alternative reference signals may be achieved by addressing samples of different reference waveforms stored in the ROMs 19, 104 respectively. Extra addressing bits are supplied from a harmonic selector 108, which is connected to some address lines of the ROMs and is arranged to select an appropriate address range, so that the samples of the required reference signal will be present at the digital outputs of the ROMs 19, 104 respectively during an addressing cycle of the counter 14.

For example, the ROM 19 might have fourteen address lines, the least significant ten bits being directly addressed by the counter 14, which is arranged to count from zero to 1023 to sequentially address the 1024 states definable with ten bits. The ROM 19 has a capacity of 16k bits. Of the remaining bits four are addressed by harmonic selector 108. For each different combination of these four address inputs, a different set of 1024 locations may be addressed. Thus for the 16k ROM, 1024 samples of sixteen different reference waveforms may be addressed. The ROM 19 is therefore loaded with samples as follows:

| Decimal Address | | Equivalent to: | | Sampled Waveforms |
|---|---|---|---|---|
| | | Harmonic select | Counter | |
| from | 0 | 0 | 0 | |
| | | | | sin wt |
| to | 1023 | 0 | 1023 | |
| from | 1024 | 1 | 0 | |
| | | | | sin 2 wt |
| to | 2047 | 1 | 1023 | |
| . | . | . | . | |
| . | . | . | . | |
| . | . | . | . | |
| from | 14336 | 14 | 0 | |
| | | | | sin 15 wt |
| to | 15359 | 14 | 1023 | |
| from | 15360 | 15 | 0 | |
| | | | | sin 16 wt |
| to | 16383 | 15 | 1023 | |

It will be appreciated that the ROM 104 may be similarly loaded with samples of the values of the functions cos wt (addresses 0 to 1023) through to cos 16 wt (addresses 15360 to 16383).

To perform a full frequency response analysis (up to the sixteenth harmonic) of the system under test 10, the embodiment is arranged to operate as follows.

Firstly the harmonic number is set to zero, and the outputs of the integrating analogue to digital converters 101, 106 are cleared. The clock 17 is enabled so that counter 14 counts from 0 to 1023 to simultaneously address the waveform ROM 12, and reference ROMs 19 and 104. Whilst the system under test 10 will be driven by a driving signal of the form sin wt, references at the fundamental frequency (sinwt, coswt) are fed to the digital inputs of multiplying analogue to digital converters 18, 103 respectively. Thus, at the end of a cycle of the counter 14, the outputs of the integrating analogue to digital converters will contain digital representations defining the characterising coefficients $a_1$, $b_1$, which may be stored for later processing or displayed as required. The outputs of the integrating analogue to digital converters may be cleared and the harmonic selector incremented by one. During a later cycle of the counter 14, the received signal is thus correlated with reference sin 2 wt, cos 2 wt to allow the second harmonic characterising coefficients $a_2$, $b_2$ to be determined. This procedure is repeated, with incremented harmonic number, until all harmonic characterising co-efficients (i.e. up to $a_{16}$, $b_{16}$) have been determined.

It will be appreciated that the operation of the embodiment requires synchronisation, and this may be achieved by control logic (not shown, but which will be readily realisable by those skilled in the art). The precise operation desirable will depend upon application, and thus the control logic may vary with application. For example, in general in most applications it is best to leave the system under test 10 permanently driven, by arranging that the counter 14 is continuously cycling.

Acquisition of any particular characterising coefficient pair may then be achieved by clearing the integrating analogue to digital converters 101, 106 in synchronism with the counter, for example by applying a clearing signal to trigger inputs 109, 110 of integrating analogue to digital converters 101, and 106 respectively. In most applications it is sufficient to leave the averaging period at $2\pi/w$, being that of the fundamental. An averaging period of a multiple of $2\pi/w$ may be used, such a longer period having the benefit of increasing noise rejection.

In some applications, it may be necessary to trigger the frequency response analyser with an externally generated driving signal. To this end, the counter 15 has a trigger signal input 111, which may, for example, reset the count to zero prior to an acquisition, and the clock 17 a synchronising input 112 so that the cycle time may be made equal to the period of an external reference. The precise operation of these synchronising and trigger features will be apparent to those skilled in the art.

It will be apparent from the foregoing that both the signal received from the system under test and the reference signal may take both positive and negative instantaneous values during the course of a cycle. This implies that the multiplying digital to analogue converters 18, 103 operate in all four quadrants, ie. both the analogue and digital inputs may take positive and negative values. Four quadrant multipliers are not readily available, and it is preferable that a two-quadrant type be used. For a two-quadrant type although the digital input can take but a single polarity, the analogue input may be of either polarity. To impose this restriction on the multiplying digital to analogue converters 18, and 103, the ROMs 19 and 104 contain positive values only, which may be regarded as positively rectified values of the reference waveforms. The signal received from the system under test 10 at input 11 is relayed to the multiplying digital to analogue converters 18, 103 via either one of a non-inverting amplifier 113, or an inverting amplifier 114, both of unity gain. The selection is controlled by a switch 115, and switch control logic 116, which is arranged such that whenever the reference signal stored in the ROM 19 should have a negative value, the inverting amplifier 114 is connected, the non-inverting amplifier 113 being connected at other times. This arrangement is effective to invert the analogue input (i.e. make it of opposite polarity) whenever the reference waveform should be negative, and effectively permits the reference to take on negative values by virtue of the commutative nature of multiplication. A straightforward way of providing an indication of the required inversion or non-inversion of the received signal is by storing a polarity bit together with the magnitude data for each sample of each reference waveform, which may be fed directly to a signal input 117 of switch control logic 116. It will be appreciated that, given that the multiplying digital to analogue converter 103 is also of the two quadrant type, then inverting amplifier 118, non-inverting amplifier 119 and switch 122, connected intermediate the received signal input 11 and the multiplying digital to analogue converter 103 allow the converter 103 to affectively operate in four quadrants in response to a polarity signal from the ROM 104 fed to the switch control logic 120 at sign input 121.

In some frequency response testing applications it is desirable that the driving signal is used to modulate a carrier signal of high frequency, which modulated carrier is then applied to the system under test. Of interest in analysis are the components of received signal at the fundamental and harmonic frequencies of the modulating driving signal. Thus, the received signal must be demodulated prior to correlation.

A signal generator 123 supplies a carrier signal which is fed to an input of an optional modulator 124. The other modulator input is fed with the driving signal derived from the waveform ROM 12 and the digital to analogue converter 15. Thus the conditioning amplifier 16 supplies a signal to the system under test 10 having the driving signal as the modulating waveform.

As an alternative to modulator 124, a multiplying digital to analogue converter may be used in the position of digital to analogue converter 15, its analogue input being supplied from generator 123 to thereby provide an effectively modulated output to amplifier 16.

Figure 2:
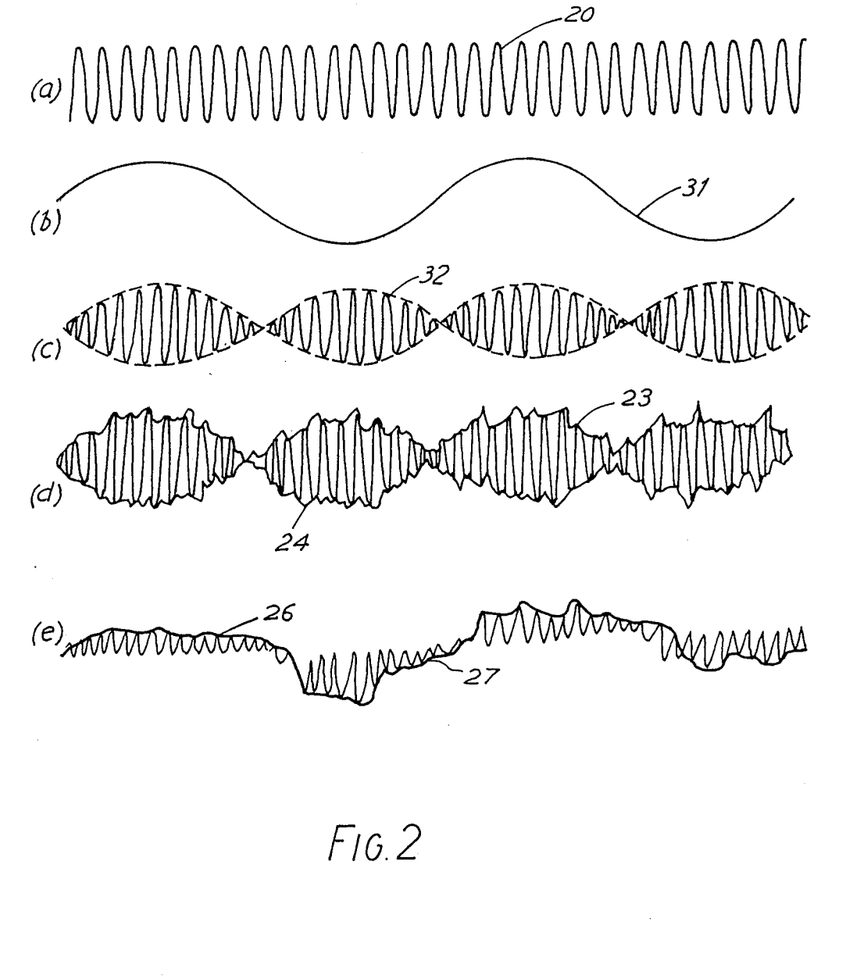
FIG. 2 shows some waveforms as might be present therein.

Generally, the carrier signal is a high frequency sinusoidal, as might, for example, be diagrammatically represented by a profile 20 (FIG. 2(a)), and the modulating driving signal is a lower frequency sinusoid, 21 (FIG. 2(b)). Hence the drive signal applied to the system under test will be a modulated waveform, 22 (FIG. 2(c)). The signal received from the system under test 10 at input 11 is of a form 23 (FIG. 2(d)), and contains frequency components for analysis as hereinbefore described. The received signal will be of the form of a modulated carrier, appearing as a sinusoid within an envelope 24. In is this enveloping waveform which is of interest in the analysis, and it may be recovered by switching the received signal of the form 23 with the polarity of the carrier signal for form 20 to give a signal of the form 26 (FIG. 2 (e)), from which the enveloping signal 27 may be recovered in accordance with known principles of demodulation. It would be a simple matter for one skilled in the art to configure the control logic (116, 120) necessary to give the required switching and inversions.

An alternative embodiment of the present invention, (FIG. 3) operates under the control of a micro-computer 30, and is arranged to operate with multiplying digital to analogue converters 31, 32, both of the one quadrant type.

Figure 3:
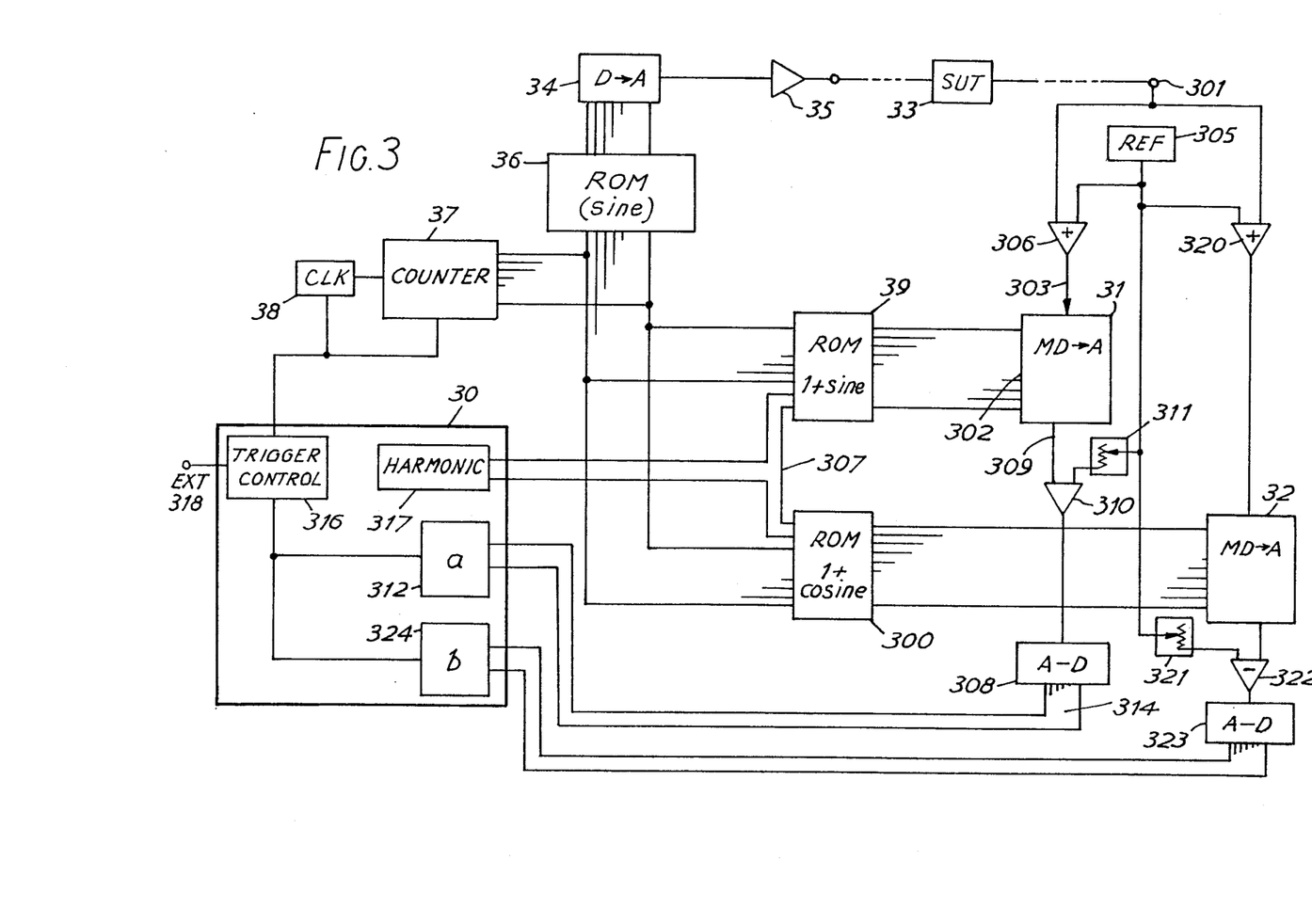
FIG. 3 represents a frequency response analyser including a one quadrant multiplying digital to analogue converter.

A driving signal is supplied to a system under test 33 from a digital to analogue converter 34 via an amplifier 35. The digital input for the digital to analogue converter 34 is derived from a ROM 36 addressed by a counter 37 controlled by a clock 38. The counter also addresses two further ROMs 39, 300. This arrangement serves to generate a driving signal and two reference signals, in a way analogous to that hereinbefore described, to permit a frequency response analysis to be carried out of the system under test 33, a signal from which is received at an input 301.

In this embodiment of the present invention, the multiplying digital to analogue converter 31 is of the one quadrant type. This means that neither the signal which is applied to its digital input via data lines 302, nor the signal applied at its analogue input on line 303 may take on negative values. In the case of the digital input supplied from the ROM 39. Where the waveform stored can take negative values, such values may be indicated by a separate sign bit not fed to the multiplying digital to analogue converter, but used in averaging, as will be described later. The instantaneous value of the signal received at the input 301 may be of either polarity. To ensure that a positive value is present on analogue line 303 a dc reference level 305 is added to the received signal by a summing amplifier 306. The magnitude of the reference of the reference level 305 is chosen in relation to the received signal such that the resulting signal, which appear an analogue input line 303, will always be of positive polarity.

Representing the received signal v(t) as before in the form:

$$V(t) = \sum_{n=1}^{N} a_n \sin m \, wt + b_n \cos m \, wt,$$

then the signal V+(t) applied to the analogue input line 303 of multiplying digital to analogue converter 32 maybe represented as:

$$V^+(t) = REF_{dc} + \sum_{n=1}^{N} a_n \sin n \, wt + b_n \cos n \, wt,$$

The reference signal samples loaded into the ROM 39 are of the waveform B.(1+sin wt) and its harmonics, which may be selected by addressing harmonic select lines 307 in a way analogous to that already described. Thus, for a particular harmonic, n, the instantaneous output of the multiplying digital to analogue converter 31 may be represented as:

$$x_{1n}(t) = REF_{dc} \cdot B(1 + \sin n \, wt) + \sum_{n=1}^{N} Ba_n(1 + \sin m \, wt) \cdot$$

-continued
$$\sin n\,wt + Bb_n(1 + \sin m\,wt)\cos n\,wt$$

Expansion of this expression gives:

$$x_{1n}(t) = REF_{dc} \cdot B + REF_{dc} \cdot B \sin wt + \sum_{n=1}^{N} B \cdot$$

$$a_n \sin n\,wt + Ba_n \cdot \cos(n-m)wt - Ba_n \cdot$$

$$\cos(n-m)wt + \sum_{n=1}^{N} B \cdot b_n \cos n\,wt + Bb_n \cdot$$

$$\sin(n-m)wt - Bb_n \cdot \sin(n+m)wt$$

It will be observed that the dc term of this expansion is ($REF_{dc} \cdot B + Ba_n$), the later component arising from the case where n=m. So that this system dependent component $Ba_n$ may be applied to the input of an analogue to digital converter for integration over a period of $2\pi/w$ (i.e. one cycle of the fundamental reference), the $REF_{dc} \cdot B$ component is subtracted from the output signal 309 of the multiplying digital to analogue converter 31 by means of a difference amplifier 310. The component for subtraction by difference amplifier 310 is derived by a scaling 311 of the reference level 305. Following this subtraction of the component $REF_{dc} \cdot B$, the only remaining dc component of the output of the multiplying digital to analogue converter 31 will be $Ba_n$, which will be the only contributor to an integration performed over the fundamental period $2\pi/w$, as will be apparent from the foregoing.

In order to perform the required integration, the resultant output from the different amplifier 310 is relayed to the analogue to digital converter 308 which, in this example, is not of the integrating type, but instead gives a series of instantaneous converted values on output lines 314, which are loaded into register 312.

At the end of the integration, the register stack 312, will contain a plurality of values which may be averaged and differenced to give a numerical value representative of the value $$\frac{Ba_n}{2},$$

and thereby related to the value of the required coefficient $a_n$. Since the register stack 312 is configured within the micro-computer 30, these essentially arithmetic operations are performed therein under micro-program control. Operation of the various components thus far may be controlled by Trigger control 316, also configured within the micro-computer 30 under program control. The trigger control 316 serves to synchronise operation by enabling the clock 38, resetting and enabling the counter 37, and setting harmonic number via harmonic control 317 to provide a partial address on lines 307. The trigger may be internally generated, or may be externally supplied via an input 318 when the use of the correlator part of the frequency response analyser with an external signal generator is required.

In arrangements where a reference signal which may take values of either polarlity (e.g. sine) is used, values may be loaded to one of two register stacks, dependent upon the polarity of the reference, for example in response to a sign bit output from reference wave ROM 39. The accumulated positive and negative values may then be added together and differenced to yield the required coefficient. The polarity switching required for demodulation may also be achieved in this way.

The components of the embodiment thus far described serve to provide the characterising coefficients $a_1$, $a_2$, $a_n$. Further analysis is performed in relation to a reference waveform $C(1+\cos nwt)$ in order to establish the remaining characterising coefficients $b_1$, $b_2$ $b_n$. To this end a reference dc level is added to the incoming signal by a summing amplifier 320, the output of which feeds multiplying digital to analogue converter 32. The reference is available in digital form from the ROM 300. The multiplied signal is differenced with a scaled reference (via scaler 321) by difference amplifier 322, to give an output for analogue to digital conversion by an analogue to digital converter 323, output values from which are loaded to register stack 324. These values may then be averaged and differenced by the micro-computer 30 under program control to yield the required characterising coefficients. The operation of this second channel is analogous to that of the first, and analogous theory may be applied thereto, making further detailed description unnecessary.

Ways in which the various controls may be generated within the micro-computer 30 under program control and the handling of the various inputs, outputs and arithmetic operations performed will be readily apparent to those skilled in the art. Alternative embodiments will also suggest themselves. For example some economy (at the expense of speed) may be derived by employing a single correlation channel only and having orthogonal reference waveforms stored in ROM. Further economy results if the generation of ROM addresses is performed by the micro-computer. For yet further economy the ROM storage may be replaced by computer memory storage. However, the embodiment as described with reference to FIG. 3 is considered to be a good compromise between the speed and modularity of dedicated hardward and the flexibility and arithmetic capability of a micro-computer.

I claim:

1. A frequency response analyser including
   a signal generator for providing a periodic driving signal,
   means for relaying the driving signal to a system under test,
   means for receiving an output signal from a system under test, in response to said driving signal,
   means for deriving a reference signal of digital form,
   a multiplying digital to analogue converter having an analogue input, a digital input and an analogue output,
   the analogue input being connected to said receiving means and the digital input being connected to said reference signal, to thereby provide a signal output representative of the product of said reference and output signals, and
   means for integrating said signal output of said multiplying digital to analogue converter over an integral number of periods of said driving signal, whereby to provide a characteristic of the response of said system under test to said driving signal.

2. A frequency response analyser as claimed in claim 1 and wherein said reference signal varies as a sine funtion of the same period as the driving signal and a second multiplying digital to analogue converter is arranged to multiply the output signal by a second reference signal which varies as a cosine function of the same period as the driving signal, a second integrating analogue to digital converter being arranged to convert the ouput of the second multiplying digital to analogue converter over an integral number of periods of the driving signal.

3. A frequency response analyser as claimed in claim 1 and wherein said reference signal varies as a first reference function during a first period to establish a first characterising coefficient and varies as a second reference function during a second period to establish a second characterising co-efficient.

4. A frequency response analyser as claimed in claim 1 and wherein the multiplying digital to analogue converter is of the one quadrant type, and means included to add in a dc level to the analogue input, and means included to subtract a related dc level intermediate the multiplying digital to analogue converter and integrating analogue to digital converter.

5. A frequency response analyser as claimed in claim 1 and wherein the multiplying digital to analogue converter is of the two quadrant type, allowing its analogue input to be of either polarity and wherein sign variation of the reference signal may be accomodated by arranging for the analogue input to be inverted wherever the reference signal should take on a negative value.

6. A frequency response analyser as claimed in claim 1 and wherein the means for deriving the reference signal includes a memory device, having values of the required reference function stored therein.

7. A frequency response analyser as claimed in claim 6 and wherein the memory is arranged to store values of the harmonics, so that harmonics of the reference signal may be used in correlation.

8. A frequency response analyser as claimed in claim 1 and wherein demodulation is achieved by rectifying the output signal from a system under test to one polarity during a first half cycle of a carrier period, and to the other polarity during the second half cycle.

9. A frequency response analyser as claimed in claim 8 and wherein a polairty switch connected to selectively invert the received signal is included and controlled to invert the output signal at every alternate half cycle of the carrier to provide rectification prior to connection to the multiplying digital to analogue converter.

10. A frequency response analyser as claimed in claim 8 and wherein the polarity of the reference signal is switched by selectively addressing samples of an inverse reference function stored in memory together with the reference signal samples.

11. A frequency response analyser as claimed in claim 1 and wherein said means for integrating said signal output of said multiplying digital to analogue converter comprises an integrating analogue to digital converter.

* * * * *